(12) United States Patent
Hao et al.

(10) Patent No.: US 10,658,352 B2
(45) Date of Patent: May 19, 2020

(54) PROTECTIVE CIRCUIT, ARRAY SUBSTRATE AND DISPLAY PANEL

(71) Applicant: BOE Technology Group Co., Ltd., Beijing (CN)

(72) Inventors: Xueguang Hao, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 16/072,863

(22) PCT Filed: Nov. 23, 2017

(86) PCT No.: PCT/CN2017/112561
§ 371 (c)(1),
(2) Date: Jul. 25, 2018

(87) PCT Pub. No.: WO2018/214434
PCT Pub. Date: Nov. 29, 2018

(65) Prior Publication Data
US 2019/0355715 A1    Nov. 21, 2019

(30) Foreign Application Priority Data

May 22, 2017    (CN) .......................... 2017 1 0364479

(51) Int. Cl.
*G06F 3/038*    (2013.01)
*G09G 5/00*    (2006.01)
(Continued)

(52) U.S. Cl.
CPC ........ *H01L 27/0251* (2013.01); *G02F 1/1368* (2013.01); *G02F 1/136204* (2013.01);
(Continued)

(58) Field of Classification Search
CPC .. G02F 1/136204; G02F 2001/133388; G09G 2330/025; G09G 2330/04; G09G 2330/06;
(Continued)

(56) References Cited

U.S. PATENT DOCUMENTS 8,085,352 B2    12/2011   Kim et al.
9,030,456 B2    5/2015    Xiao et al.
(Continued)

FOREIGN PATENT DOCUMENTS

CN    101217026 A    7/2008
CN    102592552 A    7/2012
(Continued)

OTHER PUBLICATIONS

Examination report issued in corresponding Australian Patent Application No. 2017404569, dated Apr. 17, 2019.
(Continued)

*Primary Examiner* — Insa Sadio
(74) *Attorney, Agent, or Firm* — McDermott Will & Emery LLP

(57) ABSTRACT

There is provided a protective circuit, an array substrate and a display panel. The protective circuit includes: a control sub-circuit, having a first end electrically connected to a voltage input terminal and a second end configured to output a common voltage signal supplied by the voltage input terminal; and a discharge sub-circuit, having a first end electrically connected to the second end of the control sub-circuit and a second end electrically connected to at least one data line. The discharge sub-circuit releases electric charges on the at least one data line under the control of the common voltage signal supplied from the control sub-circuit.

19 Claims, 3 Drawing Sheets

(51) Int. Cl.
- *H01L 27/02* (2006.01)
- *G02F 1/1362* (2006.01)
- *G02F 1/1368* (2006.01)
- *G09G 3/36* (2006.01)
- *H01L 27/12* (2006.01)

(52) U.S. Cl.
CPC .......... *G09G 3/3611* (2013.01); *H01L 27/124* (2013.01); *G09G 2330/027* (2013.01)

(58) Field of Classification Search
CPC ...... G09G 2330/08; G09G 3/006; G09G 3/20; G09G 3/2092; G09G 3/3611; H01L 27/0296

See application file for complete search history.

(56) References Cited

U.S. PATENT DOCUMENTS

| | | | |
|---|---|---|---|
| 2002/0075419 A1 | 6/2002 | Kwon et al. | |
| 2006/0119757 A1 | 6/2006 | Tsao | |
| 2006/0152470 A1 | 7/2006 | Kim | |
| 2006/0279510 A1 | 12/2006 | Lai | |
| 2007/0296881 A1 | 12/2007 | Choi et al. | |
| 2011/0292005 A1 | 12/2011 | Lau et al. | |
| 2012/0176359 A1 | 7/2012 | Xiao et al. | |
| 2015/0325188 A1* | 11/2015 | Wei | G09G 3/3648 345/92 |
| 2016/0027372 A1 | 1/2016 | Yan | |
| 2017/0139292 A1* | 5/2017 | Yu | G02F 1/13306 |

FOREIGN PATENT DOCUMENTS

| | | |
|---|---|---|
| CN | 102956213 A | 3/2013 |
| CN | 103345898 A | 10/2013 |
| CN | 106356033 A | 1/2017 |
| CN | 106935222 A | 7/2017 |
| JP | H06242417 A | 9/1994 |
| JP | 2008096479 A | 4/2008 |
| KR | 20060081863 A | 7/2006 |

OTHER PUBLICATIONS

Search Report and Written Opinion issued in corresponding International Patent Application No. PCT/CN2017/112561, dated Feb. 26, 2018.

Office Action issued in corresponding Chinese Patent Application No. 201710364479.0, dated Jun. 18, 2019.

Office Action issued in Korean Patent Application No. 10-2018-7029992, dated Aug. 31, 2019.

* cited by examiner

PROTECTIVE CIRCUIT, ARRAY SUBSTRATE AND DISPLAY PANEL

CROSS-REFERENCE TO RELATED APPLICATION

This application is a 371 National Stage application of International Application No. PCT/CN2017/112561, filed on Nov. 23, 2017, which has not yet published, and which claims priority to Chinese Patent Application CN201710364479.0 filed on May 22, 2017 in the State Intellectual Property Office of China, the disclosures of which are hereby incorporated by reference in their entirety.

TECHNICAL FIELD

The present disclosure relates to the field of display technology, and particularly, to a protective circuit, an array substrate and a display panel.

BACKGROUND

When a display panel of a Thin Film Transistor liquid crystal display (TFT-LCD) is at the moment of power failure, since electric charges on the data lines are not released in time, the display panel is likely to cause charge accumulation therein, resulting in its shutdown flicker. When the electric charges inside the display panel accumulate to a certain extent, electrostatic discharge occurs between the data lines, which may damage the thin film transistor device, causing the display function of the liquid crystal display panel to be failure.

SUMMARY

According to an aspect of embodiments of the present disclosure, there is provided a protective circuit for a display panel, comprising:

a control sub-circuit, having a first end electrically connected to a voltage input terminal and a second end configured to output a common voltage signal supplied by the voltage input terminal; and a discharge sub-circuit, having a first end electrically connected to the second end of the control sub-circuit and a second end electrically connected to at least one data line;

wherein the discharge sub-circuit releases electric charges on the at least one data line under the control of the common voltage signal supplied from the control sub-circuit.

In one embodiment, the control sub-circuit further comprises: a first thin-film transistor and a second thin-film transistor; both a first electrode and a gate electrode of the first thin-film transistor are electrically connected to the voltage input terminal, and a second electrode of the first thin-film transistor is electrically connected to a first electrode of the second thin-film transistor; and a second electrode of the second transistor is electrically connected to the first electrode of the first thin-film transistor, and both a first electrode and a gate electrode of the second thin-film transistor are electrically connected to an output signal line of the discharge sub-circuit.

In one embodiment, the output signal line comprises a plurality of signal lines connected in parallel with one another.

In one embodiment, the discharge sub-circuit comprises an array of third thin-film transistors, and each third thin-film transistor has both a first electrode and a gate electrode electrically connected to a signal line, corresponding to a row in which the third thin-film transistor is located, of the plurality of signal lines, and a second electrode electrically connected to a data line, corresponding to a column in which the third thin-film transistor is located, of the at least one data line.

In one embodiment, the discharge sub-circuit further comprises a plurality of charge sharing lines connected in parallel with one another.

In one embodiment, the discharge sub-circuit comprises an array of third thin-film transistors, and each third thin-film transistor has a first electrode electrically connected to a charge sharing line, corresponding to a column in which the third thin-film transistor is located, of the plurality of charge sharing lines, a second electrode electrically connected to a data line, corresponding to a column in which the third thin-film transistor is located, of the at least one data line, and a gate electrode electrically connected to a signal line, corresponding to a row in which the third thin-film transistor is located, of the plurality of signal lines.

In one embodiment, the discharge sub-circuit comprises an array of third thin-film transistors, each third thin-film transistor has a first electrode electrically connected to a data line, adjacent to the first electrode, of the at least one data line, a second electrode electrically connected to a data line, adjacent to the second electrode, of the at least one data line, and a gate electrode electrically connected to a signal line, corresponding to a row in which the third thin-film transistor is located, of the plurality of signal lines.

In one embodiment, potential of the plurality of charge sharing lines is floating potential.

In one embodiment, the first thin-film transistor is a N-type thin-film transistor or a P-type thin-film transistor, the second thin-film transistor is a P-type thin-film transistor or a N-type thin-film transistor, and the third thin-film transistor is a N-type thin-film transistor or a P-type thin-film transistor.

According to another aspect of embodiments of the present disclosure, there is provided an array substrate comprising the abovementioned protective circuit, which is provided at a signal input terminal of a signal line of the array substrate and/or an opposite side of the signal input terminal of the signal line.

According to yet another aspect of embodiments of the present disclosure, there is provided a display panel comprising the abovementioned array substrate.

BRIEF DESCRIPTION OF THE DRAWINGS

In order to more clearly illustrate the technical solutions according to embodiments of the present disclosure, the drawings of the embodiments will be briefly described hereinafter. It is apparent that the drawings in the following description relate only to some embodiments of the present disclosure, and are not intended to limit the present disclosure.

DETAILED DESCRIPTION OF THE EMBODIMENTS

In order to make the objects, technical solutions and advantages of the embodiments of the present disclosure clearer, the technical solutions according to the embodiments of the present disclosure will be clearly and completely described below in conjunction with the drawings according to the embodiments of the present disclosure. It is apparent that the described embodiments are some of the embodiments of the present disclosure, and not all of the embodiments. All other embodiments obtained by those skilled in the art based on the described embodiments of the present disclosure without involving creative labor are within the scope of the present disclosure.

Unless otherwise defined, technical terminologies or scientific terminologies used in the present disclosure are intended to be understood as the ordinary meaning of them by those skilled in the art. The words "first", "second" and the like used in the present disclosure do not denote any order, quantity, or importance, but are used to distinguish different components. The word "comprising" or "including" and the like, is intended to mean that the element or item that appears before the word includes the element(s) or item(s) listed after the word and their equivalents, and do not exclude other element(s) or item(s). The word "connect to" or "connect with" and the like are not limited to physical or mechanical connections, but may include electrical connections, whether direct or indirect. "Upper", "lower", "left", "right", etc. are only used to indicate the relative positional relationship, and when the absolute position of the object to be described is changed, the relative positional relationship may also change accordingly.

In the present disclosure, a Thin Film Transistor (TFT) is abbreviated as a TFT. Correspondingly, a first thin film transistor is abbreviated as TFT01, a second thin film transistor is abbreviated as TFT02, and a third thin film transistor is abbreviated as TFT03. Moreover, in the present disclosure, a source electrode and a drain electrode can be used interchangeably.

Figure 1:
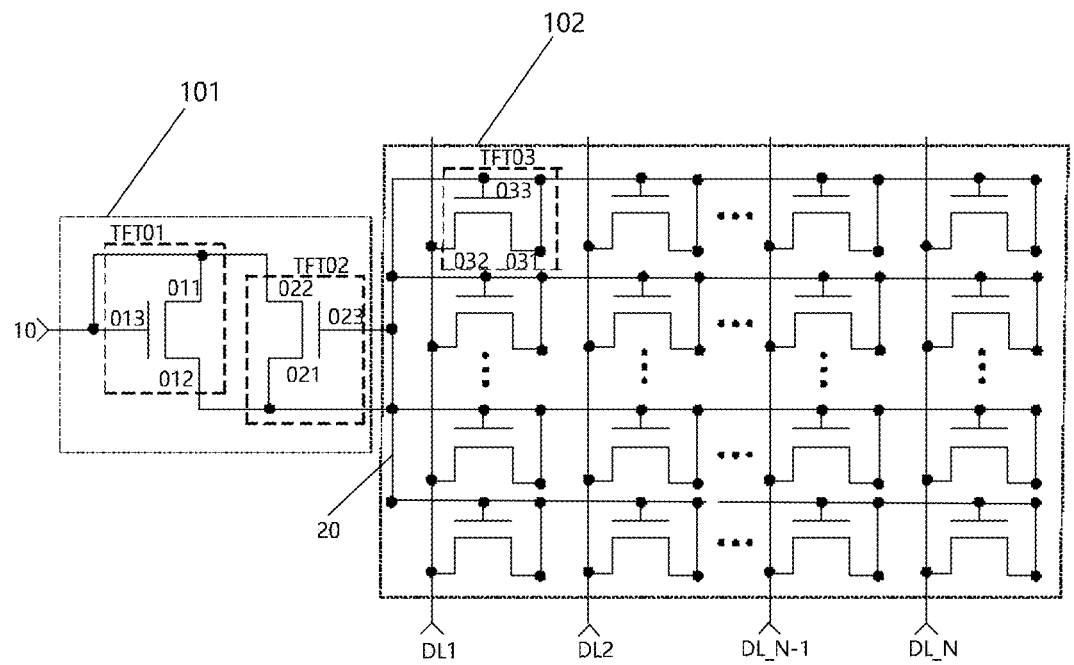
FIG. 1 is a schematic view showing a structure of a protective circuit according to an embodiment of the present disclosure.

According to embodiments of the present disclosure, there is provided a protective circuit. Referring to FIG. 1, the protective circuit includes a control sub-circuit 101 and a discharge sub-circuit 102. The control sub-circuit 101 includes a TFT 01 and a TFT 02. Both a gate electrode and a source electrode of the TFT 01 are electrically connected to a voltage input terminal 10, and the voltage input terminal 10 provides a common voltage signal. A drain electrode of the TFT 01 is electrically connected to a source electrode of the TFT 02. A drain electrode of the TFT 02 is electrically connected to the source electrode of the TFT 01, and both the source electrode and a gate electrode of the TFT 02 are electrically connected to an output signal line 20 of the discharge sub-circuit 102. The output signal line 20 of the discharge sub-circuit 102 includes a plurality of signal lines connected in parallel with one another. The TFT 01 and TFT 02 of the control sub-circuit 101 are configured to output the common voltage signal supplied from the voltage input terminal 10 to the output signal line 20 of the discharge sub-circuit 102.

The discharge sub-circuit 102 includes an array of TFTs 03, and the number of columns of the TFTs 03 in the array corresponds to the number of data lines. A drain electrode of each TFT 03 in each column of the TFTs 03 is electrically connected to the data line corresponding to the column, and both a source electrode and a gate electrode of the TFT 03 are electrically connected to the output signal line 20 of the discharge sub-circuit 102. The TFT 03 is configured to discharge electric charges on the data line to the output signal line 20 of the discharge sub-circuit 102 under the control of the common voltage signal supplied from the control sub-circuit 101.

An array substrate of a display panel may include a base substrate, a protective circuit, a pixel unit, and a gate line and a data line formed on the base substrate. In the embodiments of the present disclosure, the output signal line of the discharge sub-circuit in the protective circuit is set in the same layer as the gate line, wherein the output signal line includes a plurality of signal lines connected in parallel with each other. Both the gate electrode and the source electrode of the TFT 02 of the control sub-circuit are electrically connected to the output signal line. Both the gate electrode and the source electrode of the TFT 03 of the discharge sub-circuit are electrically connected to a signal line, corresponding to a row in which the TFT 03 is located, of the plurality of signal lines, and the drain electrode of the TFT 03 is electrically connected to a data line, corresponding to a column in which the TFT 03 is located, of the data lines.

During the power-off of the display panel, the gate electrode signal control terminal controls the thin film transistor of the pixel unit to be turned off via the gate line. At this time, electric charges on the data line are not released in time, and charge accumulation occurs. Since the pixel unit cannot stop working immediately, the display panel has problems such as shutdown flicker, electrostatic discharge damage and the like.

In the embodiments of the present disclosure, both the gate electrode and the source electrode of the TFT 03 of the discharge sub-circuit 102 are electrically connected to the voltage input terminal 10 via the output signal line 20 of the discharge sub-circuit and the control sub-circuit 101, while the drain electrode of the TFT 03 is electrically connected to the data line. The output signal line 20 of the discharge sub-circuit 102 and the voltage input terminal 10 are formed on the base substrate of the array substrate. Provided that the protective circuit according to the embodiments of the present disclosure is used, if charge accumulation occurs on the data line during the power-off of the display panel, the voltage input terminal 10 provides a common voltage signal, to turn on the TFT 01 and TFT 02 of the control sub-circuit 101, and the output signal line 20 of the control discharge sub-circuit 102 is controlled to output the common voltage signal, to turn on the TFT 03 of the discharge sub-circuit 102, and electric charges on the data line are released to the output signal line 20 of the discharge sub-circuit 102 via the TFT 03. Therefore, occurrence of flickering and electrostatic discharge damage of the display panel, due to the inability of electric charges on the data line to be completely and quickly released, is avoided.

In the embodiments of the present disclosure, the TFT 01, the TFT 02 and the TFT 03 may be an N-type thin film transistor or a P-type thin film transistor. If the TFT 01, the TFT 02 and the TFT 03 are N-type thin film transistors, the TFT 01, the TFT 02 and the TFT 03 are turned on when the voltage input terminal 10 supplies a common voltage signal which is at high-level. If the TFT 01, the TFT 02 and the TFT 03 are P-type thin film transistors, the TFT 01, the TFT 02 and the TFT 03 are turned on when the voltage input terminal 10 supplies a common voltage signal which is at low-level.

Figure 2:
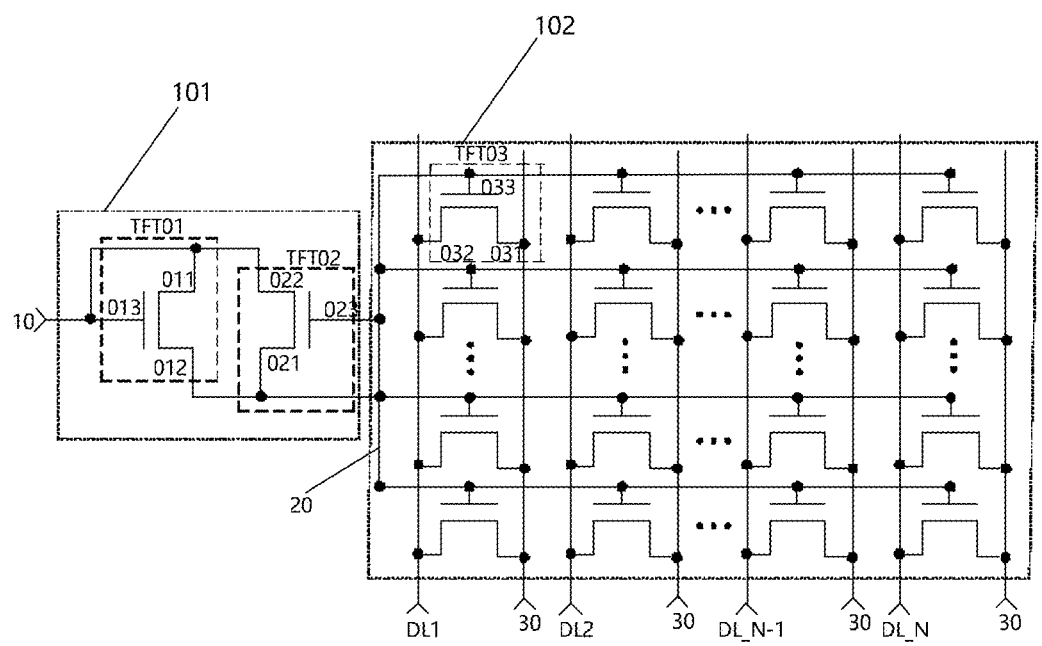
FIG. 2 is a schematic view showing a structure of a protective circuit according to another embodiment of the present disclosure.

According to embodiments of the present disclosure, there is provided a protective circuit. Referring to FIG. 2, the protective circuit includes a control sub-circuit 101 and a discharge sub-circuit 102. The control sub-circuit 101 includes a TFT 01 and a TFT 02. Both a gate electrode and a source electrode of the TFT 01 are electrically connected to the voltage input terminal 10, and the voltage input terminal 10 provides a common voltage signal. A drain electrode of the TFT 01 is electrically connected to a source electrode of the TFT 02. A drain electrode of the TFT 02 is electrically connected to the source electrode of the TFT 01, and both the drain electrode and a gate electrode of the TFT 02 are electrically connected to the output signal line 20 of the discharge sub-circuit 102. The output signal line 20 of the discharge sub-circuit 102 includes a plurality of signal lines connected in parallel with one another. The TFT 01 and the TFT 02 are configured to output the common voltage signal to the output signal line 20 of the discharge sub-circuit 102 under the control of the common voltage signal supplied from the voltage input terminal 10.

The discharge sub-circuit 102 includes an array of TFTs 03, and the number of columns of the TFTs 03 in the array corresponds to the number of data lines. A drain electrode of each TFT 03 is electrically connected to the data line corresponding to a column in which the TFT is located, and a gate electrode of the TFT 03 is electrically connected to a signal line 20, corresponding to a row in which the TFT 03 is located, of the plurality of signal lines 20. The discharge sub-circuit 102 further includes a plurality of charge sharing lines 30 connected in parallel with one another, a source electrode of the each of the TFTs 03 is electrically connected to a charge sharing line 30, corresponding to a column in which the TFT 03 is located, of the charge sharing lines 30. The TFTs 03 are configured to discharge electric charges on the data line to the charge sharing lines 30 under the control of the common voltage signal output by the control sub-circuit 101.

An array substrate of a display panel may include a base substrate, a protective circuit, a pixel unit, and a gate line and a data line formed on the base substrate. In the embodiments of the present disclosure, the output signal line 20 of the discharge sub-circuit in the protective circuit is set in the same layer as the gate line, and the charge sharing line 30 is set in the same layer as the data line. The output signal line 20 includes a plurality of signal lines connected in parallel with one another, and both a gate electrode and a source electrode of the TFT 02 of the control sub-circuit are electrically connected to the output signal line. A source electrode of the TFT 03 of the discharge sub-circuit is electrically connected to the data line, a gate electrode of the TFT 03 is electrically connected to the signal line, and a drain electrode of the TFT 03 is electrically connected to the charge sharing line 30.

During the power-off of the display panel, the gate electrode signal control terminal controls the thin film transistor of the pixel unit to be turned off via the gate line. At this time, electric charges on the data line are not released in time, and charge accumulation occurs. Since the pixel unit cannot stop working immediately, the display panel has problems such as shutdown flicker, electrostatic discharge damage and the like.

In the embodiments of the present disclosure, the gate electrode of the TFT 03 of the discharge sub-circuit 102 is electrically connected to the voltage input terminal 10 via the output signal line 20 of the discharge sub-circuit 102 and the control sub-circuit 101, and the drain electrode of the TFT 03 is electrically connected to the data line, and the source electrode of the TFT 03 is electrically connected to the charge sharing line 30. The output signal line 20 and the charge sharing line 30 of the discharge sub-circuit 102 and the voltage input terminal 10 are formed on the base substrate of the array substrate. Provided that the protective circuit according to the embodiments of the present disclosure is used, if charge accumulation occurs on the data line during the power-off of the display panel, the voltage input terminal 10 provides a common voltage signal, to turn on the TFT 01 and TFT 02 of the control sub-circuit 101, and the output signal line 20 of the discharge sub-circuit 102 outputs a common voltage signal, to turn on the TFT 03 of the discharge sub-circuit 102, and electric charges on the data line are released to the charge sharing line 30 of the discharge sub-circuit 102 via the TFT 03. Therefore, occurrence of flickering and electrostatic discharge damage of the display panel, due to the inability of electric charges on the data line to be completely and quickly released, is avoided.

In the embodiment of the present disclosure, the TFT 01, the TFT 02 and the TFT 03 may be an N-type thin film transistor or a P-type thin film transistor. If the TFT 01, the TFT 02 and the TFT 03 are N-type thin film transistors, the TFT 01, the TFT 02 and the TFT 03 are turned on when voltage input terminal 10 supplies a common voltage signal which is at high-level. If the TFT 01, the TFT 02 and the TFT 03 are P-type thin film transistors, the TFT 01, the TFT 02 and the TFT 03 are turned on when the voltage input terminal 10 supplies a common voltage signal which is at low-level.

Figure 3:
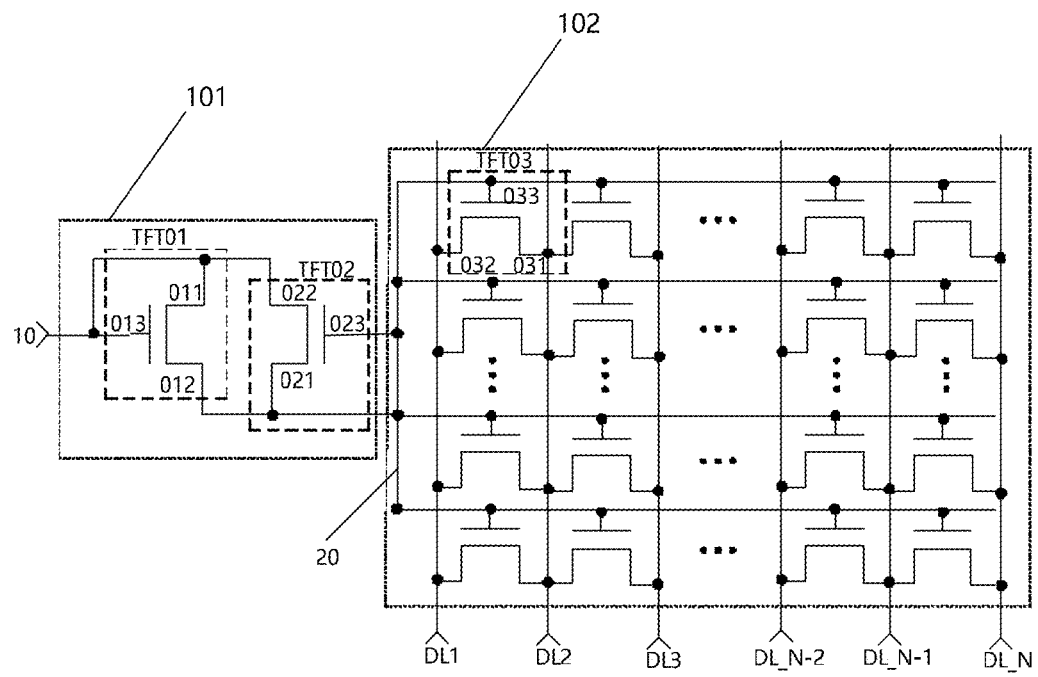
FIG. 3 is a schematic view showing a structure of a protective circuit according to yet another embodiment of the present disclosure.

According to embodiments of the present disclosure, there is provided a protective circuit. Referring to FIG. 3, the protective circuit includes a control sub-circuit 101 and a discharge sub-circuit 102. The control sub-circuit 101 includes a TFT 01 and a TFT 02. Both a gate electrode and a source electrode of the TFT 01 are electrically connected to the voltage input terminal 10, and the voltage input terminal 10 provides a common voltage signal. A drain electrode of the TFT 01 is electrically connected to a source electrode of the TFT 02. A drain electrode of the TFT 02 is electrically connected to the source electrode of the TFT 01. Both the source electrode and a gate electrode of the TFT 02 are electrically connected to the output signal line 20 of the discharge sub-circuit 102. The output signal line 20 of the discharge sub-circuit 102 includes a plurality of signal lines connected in parallel with one another. The TFT 01 and the TFT 02 are configured to output the common voltage signal to the output signal line 20 of the discharge sub-circuit 102 under the control of the common voltage signal supplied from the voltage input terminal 10.

The discharge sub-circuit 102 includes an array of TFTs 03, and the number of columns of the TFTs 03 in the array corresponds to the number of data lines. A source electrode of each TFT 03 is electrically connected to a data line, adjacent to the first electrode, of the data lines, a second electrode of the TFT 03 is electrically connected to a data line, adjacent to the second electrode, of the data lines, and a gate electrode of the TFT 03 is electrically connected to a signal line, corresponding to a row in which the TFT 03 is located, of the plurality of signal lines. The TFT 03 is configured to neutralize positive and negative charges on adjacent data lines under the control of the common voltage signal output by the control sub-circuit 101.

An array substrate of a display panel includes a base substrate, a protective circuit, a pixel unit, and a gate line and a data line formed on the base substrate. In the embodiments of the present disclosure, the output signal line 20 of the discharge sub-circuit in the protective circuit is set in the same layer as the gate line, wherein the output signal line 20 includes a plurality of output signal lines connected in parallel with one another. Both the gate electrode and the source electrode of the TFT02 of the control sub-circuit in the protective circuit are electrically connected to the output signal line. Both the source electrode and the drain electrode of the TFT 03 of the discharge sub-circuit are electrically connected to the data lines adjacent thereto, respectively, and the gate electrode of the TFT 03 is electrically connected to a signal line, corresponding to a row in which the TFT 03 is located, of the plurality of signal lines.

During the power-off of the display panel, the gate electrode signal control terminal controls the thin film transistor of the pixel unit to be turned off via the gate line. At this time, electric charges on the data line are not released in time, and charge accumulation occurs. Since the pixel unit cannot stop working immediately, the display panel has problems such as shutdown flicker, electrostatic discharge damage and the like.

In the embodiment of the present disclosure, the gate electrode of the TFT 03 of the discharge sub-circuit 102 is electrically connected to the voltage input terminal 10 via the output signal line 20 of the discharge sub-circuit 102 and the control sub-circuit 101. The drain electrode and the source electrode of the TFT 03 are electrically connected to the data lines adjacent thereto, respectively. The output signal line 20 of the discharge sub-circuit 102 and the voltage input terminal 10 are formed on the base substrate of the array substrate. Provided that the protective circuit according to the embodiment of the present disclosure is used on the array substrate, if charge accumulation occurs on the data line during the power-off of the display panel, the voltage input terminal 10 provides a common voltage signal, to turn on the TFT 01 and the TFT 02 of the control sub-circuit 101, such that the output signal line 20 of the discharge sub-circuit 102 outputs the common voltage signal. The common voltage signal controls the TFT 03 of the discharge sub-circuit 102 to be turned on, so that positive and negative charges on adjacent data lines are neutralized. Therefore, occurrence of flickering and electrostatic discharge damage of the display panel, due to the inability of electric charges on the data line to be completely and quickly released, is avoided.

In the embodiments of the present disclosure, the TFT 01, the TFT 02, and the TFT 03 may be an N-type thin film transistor or a P-type thin film transistor. If the TFT 01, the TFT 02 and the TFT 03 are N-type thin film transistors, the TFT 01, the TFT 02 and the TFT 03 are turned on when the voltage input terminal 10 supplies a common voltage signal which is at high-level. If the TFT 01, the TFT 02 and the TFT 03 are P-type thin film transistors, the TFT 01, the TFT 02 and the TFT 03 are turned on when the voltage input terminal 10 supplies a common voltage signal which is at low-level.

According to embodiments of the present disclosure, there is provided a display panel that includes at least one of the protective circuits according to any one of the abovementioned embodiments.

Figure 4:
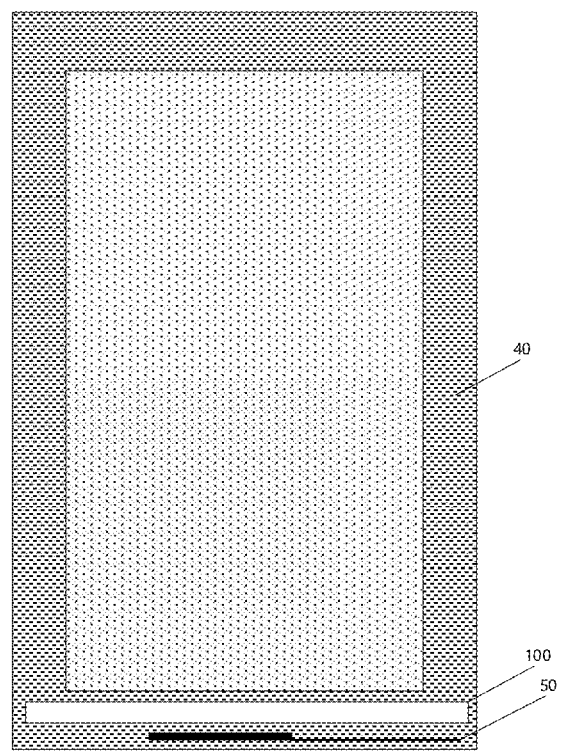
FIG. 4 is a schematic view showing a protective circuit provided at a signal input terminal of a data line, according to an embodiment of the present disclosure.
Figure 5:
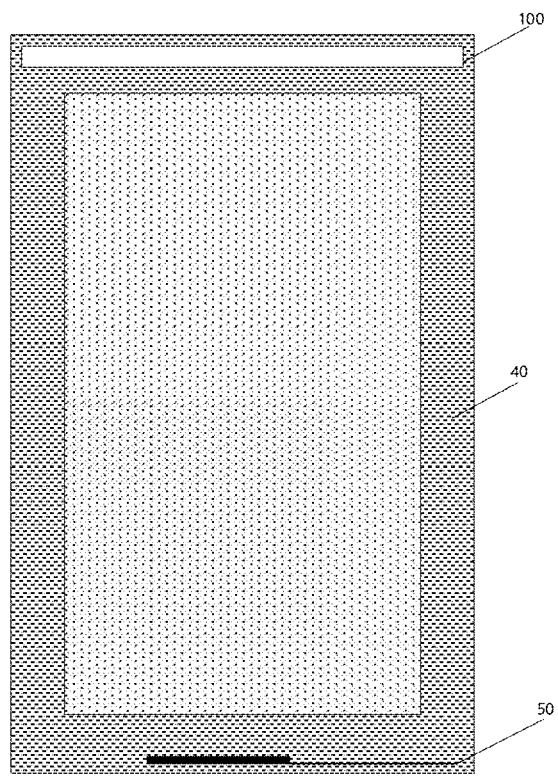
FIG. 5 is a schematic view showing a protective circuit provided at an opposite side of a signal input terminal of a data line, according to another embodiment of the present disclosure.
Figure 6:
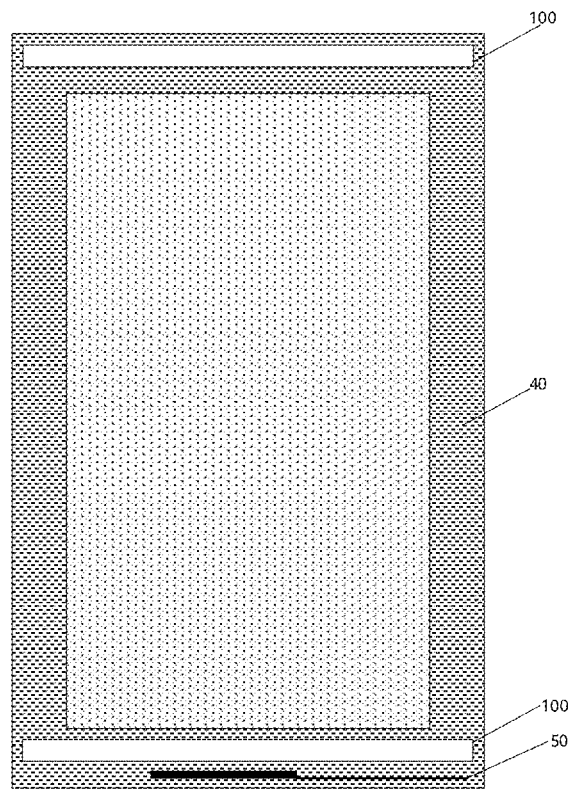
FIG. 6 is a schematic view showing protective circuits provided at a data line signal input terminal and at an opposite side of a signal input terminal of a data line, according to yet another embodiment of the present disclosure.

In the present disclosure, a protective circuit is provided on an array substrate in a liquid crystal display panel, for example, structure of the protective circuit is as shown in FIG. 1 to FIG. 3. Referring to FIG. 4, the protective circuit 100 may be provided on a data line signal input terminal of the data line driving chip 50 in the array substrate 40 of the liquid crystal display panel. Referring to FIG. 5, the protective circuit 100 may also be disposed on an opposite side of the signal input terminal of the data line driving chip 50 in the array substrate 40 of the liquid crystal display panel. Referring to FIG. 6, the protective circuit 100 can also be disposed both on the data line signal input terminal of the data line driving chip 50 in the array substrate 40 of the liquid crystal display panel and on the opposite side of the signal input terminal.

The abovementioned description is only some embodiments of the present disclosure, and is not intended to limit the present disclosure. Any modifications, equivalent substitutions, improvements, etc. within the spirit and principles of the present disclosure should be included within the protective scope of the present disclosure.

What is claimed is:

1. A protective circuit for a display panel, comprising:
    a control sub-circuit, having a first end electrically connected to a voltage input terminal and a second end configured to output a common voltage signal supplied by the voltage input terminal; and
    a discharge sub-circuit, having a first end electrically connected to the second end of the control sub-circuit and multiple second ends each electrically connected to a data line;
    wherein the discharge sub-circuit releases electric charges on the at least one data line under the control of the common voltage signal supplied from the control sub-circuit.

2. The protective circuit of claim 1, wherein the control sub-circuit further comprises:
    a first thin-film transistor and a second thin-film transistor;
    wherein both a first electrode and a gate electrode of the first thin-film transistor are electrically connected to the voltage input terminal, and a second electrode of the first thin-film transistor is electrically connected to a first electrode of the second thin-film transistor; and
    a second electrode of the second thin-film transistor is electrically connected to the first electrode of the first thin-film transistor, and both a first electrode and a gate electrode of the second thin-film transistor are electrically connected to an output signal line of the discharge sub-circuit.

3. The protective circuit of claim 1, wherein the output signal line comprises a plurality of signal lines connected in parallel with one another.

4. The protective circuit of claim 3, wherein the discharge sub-circuit comprises an array of third thin-film transistors, and each third thin-film transistor has both a first electrode and a gate electrode electrically connected to a signal line, corresponding to a row in which the third thin-film transistor is located, of the plurality of signal lines, and a second electrode electrically connected to a data line, corresponding to a column in which the third thin-film transistor is located, of the at least one data line.

5. The protective circuit of claim 3, wherein the discharge sub-circuit further comprises a plurality of charge sharing lines connected in parallel with one another.

6. The protective circuit of claim 5, wherein the discharge sub-circuit comprises an array of third thin-film transistors, and each third thin-film transistor has a first electrode electrically connected to a charge sharing line, corresponding to a column in which the third thin-film transistor is located, of the plurality of charge sharing lines, a second electrode electrically connected to a data line, corresponding to a column in which the third thin-film transistor is located, of the at least one data line, and a gate electrode electrically connected to a signal line, corresponding to a row in which the third thin-film transistor is located, of the plurality of signal lines.

7. The protective circuit of claim 3, wherein the discharge sub-circuit comprises an array of third thin-film transistors, each third thin-film transistor has a first electrode electrically connected to a data line, adjacent to the first electrode, of the at least one data line, a second electrode electrically connected to a data line, adjacent to the second electrode, of the at least one data line, and a gate electrode electrically connected to a signal line, corresponding to a row in which the third thin-film transistor is located, of the plurality of signal lines.

8. The protective circuit of claim 5, wherein potential of the plurality of charge sharing lines is floating potential.

9. The protective circuit of claim 1, wherein the first thin-film transistor is a N-type thin-film transistor or a P-type thin-film transistor, the second thin-film transistor is a P-type thin-film transistor or a N-type thin-film transistor, and the third thin-film transistor is a N-type thin-film transistor or a P-type thin-film transistor.

10. An array substrate comprising the protective circuit of claim 1, which is provided at a signal input terminal of a signal line of the array substrate and/or an opposite side of the signal input terminal of the signal line.

11. A display panel comprising the array substrate of claim 10.

12. The array substrate of claim 10, wherein, in the protective circuit, the control sub-circuit further comprises:
a first thin-film transistor and a second thin-film transistor;
wherein both a first electrode and a gate electrode of the first thin-film transistor are electrically connected to the voltage input terminal, and a second electrode of the first thin-film transistor is electrically connected to a first electrode of the second thin-film transistor; and
a second electrode of the second thin-film transistor is electrically connected to the first electrode of the first thin-film transistor, and both a first electrode and a gate electrode of the second thin-film transistor are electrically connected to an output signal line of the discharge sub-circuit.

13. The array substrate of claim 10, wherein, in the protective circuit, the output signal line comprises a plurality of signal lines connected in parallel with one another.

14. The array substrate of claim 13, wherein, in the protective circuit, the discharge sub-circuit comprises an array of third thin-film transistors, and each third thin-film transistor has both a first electrode and a gate electrode electrically connected to a signal line, corresponding to a row in which the third thin-film transistor is located, of the plurality of signal lines, and a second electrode electrically connected to a data line, corresponding to a column in which the third thin-film transistor is located, of the at least one data line.

15. The array substrate of claim 13, wherein, in the protective circuit, the discharge sub-circuit further comprises a plurality of charge sharing lines connected in parallel with one another.

16. The array substrate of claim 15, wherein, in the protective circuit, the discharge sub-circuit comprises an array of third thin-film transistors, and each third thin-film transistor has a first electrode electrically connected to a charge sharing line, corresponding to a column in which the third thin-film transistor is located, of the plurality of charge sharing lines, a second electrode electrically connected to a data line, corresponding to a column in which the third thin-film transistor is located, of the at least one data line, and a gate electrode electrically connected to a signal line, corresponding to a row in which the third thin-film transistor is located, of the plurality of signal lines.

17. The array substrate of claim 13, wherein, in the protective circuit, the discharge sub-circuit comprises an array of third thin-film transistors, each third thin-film transistor has a first electrode electrically connected to a data line, adjacent to the first electrode, of the at least one data line, a second electrode electrically connected to a data line, adjacent to the second electrode, of the at least one data line, and a gate electrode electrically connected to a signal line, corresponding to a row in which the third thin-film transistor is located, of the plurality of signal lines.

18. The array substrate of claim 15, wherein, in the protective circuit, potential of the plurality of charge sharing lines is floating potential.

19. The array substrate of claim 10, wherein, in the protective circuit, the first thin-film transistor is a N-type thin-film transistor or a P-type thin-film transistor, the second thin-film transistor is a P-type thin-film transistor or a N-type thin-film transistor, and the third thin-film transistor is a N-type thin-film transistor or a P-type thin-film transistor.

* * * * *